(12) United States Patent  (10) Patent No.: US 8,555,138 B2
Alapuranen  (45) Date of Patent: Oct. 8, 2013

(54) SYMBOL ERROR DETECTION METHOD

(75) Inventor: Pertti Alapuranen, Deltona, FL (US)

(73) Assignee: XG Technology, Inc., Sarasota, FL (US)

( * ) Notice: Subject to any disclaimer, the term of this patent is extended or adjusted under 35 U.S.C. 154(b) by 34 days.

(21) Appl. No.: 13/486,066

(22) Filed: Jun. 1, 2012

(65) Prior Publication Data

US 2012/0317455 A1  Dec. 13, 2012

Related U.S. Application Data

(60) Provisional application No. 61/494,505, filed on Jun. 8, 2011.

(51) Int. Cl.
*H03M 13/00* (2006.01)
*H03M 13/03* (2006.01)
*H04J 11/00* (2006.01)

(52) U.S. Cl.
USPC ............ 714/758; 714/796; 714/776; 370/203

(58) Field of Classification Search
USPC ......... 714/758, 796, 745, 776, 780, 793–794, 714/799, 746, 752; 375/224, 227, 240.27, 375/341; 370/241, 242, 203, 204, 208, 335
See application file for complete search history.

(56) References Cited

U.S. PATENT DOCUMENTS

| | | | |
|---|---|---|---|
| 5,502,735 A * | 3/1996 | Cooper | 714/794 |
| 6,950,474 B1 * | 9/2005 | Sudo | 375/260 |
| 8,155,249 B2 * | 4/2012 | Liu et al. | 375/341 |
| 2008/0065968 A1 | 3/2008 | Jain et al. | |
| 2011/0015931 A1 | 1/2011 | Kawahara et al. | |

* cited by examiner

*Primary Examiner* — Christine Tu
(74) *Attorney, Agent, or Firm* — Dennis L. Cook, Esq.

(57) ABSTRACT

The invention disclosed in this application describes an error detection method that can be used to identify an OFDM symbol that is interfered with. The method is based on computing a symbol by symbol path error metric from error correction code and by comparing the statistics of each individual symbol to the mean and the variance of the metric computed from the whole data packet.

1 Claim, 1 Drawing Sheet

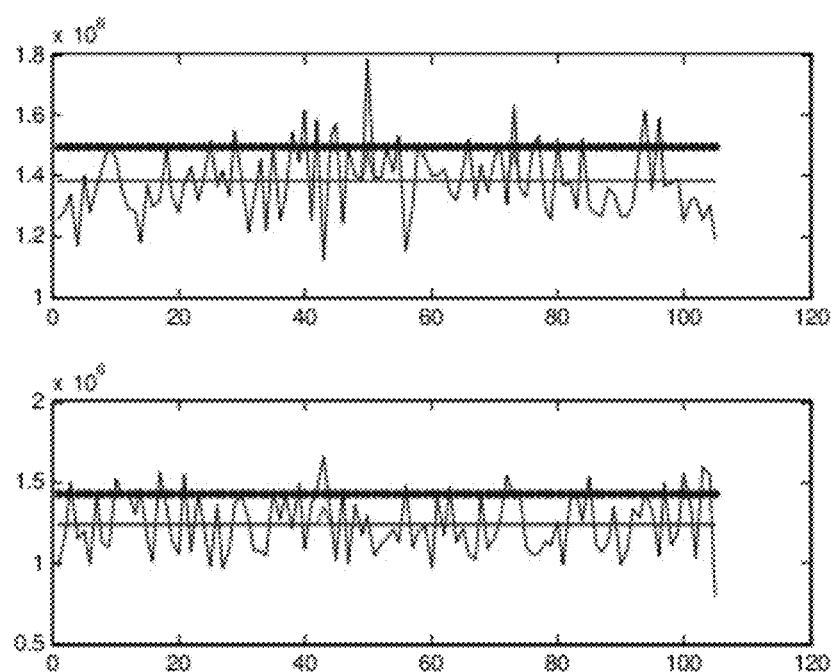

SYMBOL ERROR DETECTION METHOD

CROSS-REFERENCE TO RELATED APPLICATION

The present application claims the benefit of previously filed Provisional Patent Application Ser. No. 61/494,505 filed Jun. 8, 2011.

FIELD OF THE INVENTION

This invention describes an error detection method that can be used to identify an OFDM (orthogonal frequency division multiplexing) symbol that is interfered with. More specifically the method is based on computing a symbol by symbol path error metric from the error correction code and by comparing the statistics of each individual symbol to the mean and the variance of the metric computed from the whole data packet.

BACKGROUND OF THE INVENTION

Classical cognitive radios change frequency channels when the radio detects that the interference level or other parameters associated with operation can be improved by moving to another frequency. Modern signal processing and multiple antenna technologies, however, allow expanded cognitive operation where receiver algorithms and transmit waveforms can be instantly and dynamically adjusted for operation in a particular environment.

Radio spectrum is a limited resource. A large amount of spectrum is required to deliver services that are associated with modern wireless personal communications. Typical examples are smart phone Internet applications, wireless streaming audio, and video, to mention a few. These services consume large amounts of spectral resources causing both financial and spectrum policy issues.

Typically these services are provided using licensed spectrum. The financial burden from licensing can be defined as a cost of billions of dollars, even for a relatively small amount of spectrum, when compared to freely available unlicensed spectrum. The licensing, however, is required to make sure that current 1G to 4G radio technologies have the coordinated access they require to deliver quality of service that is adequate for an end user application.

Currently in United States there are several hundred MHz of unlicensed spectrum that can be used for delivering wireless services to consumers, however, traditional radio technologies typically suffer from interference from uncoordinated access from other unlicensed users. A novel radio technology is required that can deliver service while being highly resistant to interference while also creating as little interference as possible to other users in the unlicensed band.

Cyclic Redundancy Check (CRC) is used to indicate if a transmitted data packet has bit errors in it. This is computed for a complete data packet that typically consists of many OFDM symbols. However, improved interference mitigation algorithms can be used if the receiver can determine, with high probability, that a specific OFDM symbol has bit errors in it caused by interference.

The method described in this invention can be used to compute an indication of the probability of an OFDM symbol to contain bit errors when decoded, allowing localization of the error burst in the time domain.

BRIEF SUMMARY OF THE INVENTION

The invention disclosed in this application describes an error detection method that can be used to identify an OFDM symbol that is interfered with. The method is based on computing a symbol by symbol path error metric from the error correction code and by comparing the statistics of each individual symbol to the mean and the variance of the metric computed from the whole data packet.

The method described in this invention can be used to compute an indication of the probability of an OFDM symbol to contain bit errors when decoded, allowing localization of the error burst in the time domain.

Therefore the objects of this invention include the following:

A method to compute the probability of an OFDM symbol to contain one or more bit errors by computing a cumulative symbol by symbol path metric. The cumulative path metric is computed by summing surviving branch metrics from all states in a MLSE (Maximum Likelihood Sequence Estimator) decoder. One implementation of this type of decoder is based on a well known Viterbi algorithm.

A method where the symbol path metric is compared to the mean and the standard deviation of the metric computed from a larger number of symbols from the same data packet. The larger number may be all OFDM symbols contained in a data packet, where packet is defined as all bits that are convolution encoded and protected with a CRC, i.e. where a decision can be made if decoded data has bit error or errors for a number of bits produced from one or more OFDM symbols.

A method as described above where the effect of punctured bits are removed by not adding the branch metric to the cumulative symbol metric after a punctured bit is added to the input bit steam and is processed with the algorithm.

For a fuller understanding of the nature and objects of the invention, reference should be made to the following detailed description taken in connection with the accompanying drawing.

DESCRIPTION OF THE DRAWINGS

For a fuller understanding of the nature and objects of the invention, reference should be made to the accompanying drawing, in which:

FIG. 1 is a diagram showing a OFDM symbol path metric for two redundant packets sent at different times.

DETAILED DESCRIPTION OF THE INVENTION

The goal behind the invention is to identify OFDM symbols that, by a very high probability, will contain bit errors when decoded. A receiver that mitigates burst interferers can use redundancy, i.e. receive multiple copies of the same signal to mitigate burst interferers. There are many methods to implement redundancy and one form is to increase the modulation rate by a factor of two and send two copies separated by some time delta. The receiver for this method can decode redundant data packets and choose the one that is correct. In reality, however, the interference is often in short bursts, thus randomly interfering with individual OFDM symbols. In this type of interference long duration (in time) data packets often have one or more OFDM symbols interfered with and cannot be decoded unless a very low coding rate, or an impractically long time domain interleaver, is used.

The algorithm disclosed in this application computes cumulative path metrics similar to a Viterbi decoding algorithm but instead of maintaining a cumulative path metric for the whole data packet that is convolution encoded the algorithm computes a cumulative path metric for each OFDM symbol that the bit that is decoded is produced from.

In the disclosed preferred embodiment of the algorithm a ½ rate convolution code is used. Each input bit into the encoder produces two output bits. In the decoder the maximum likelihood sequence estimator (Viterbi algorithm) takes two bits at a time and computes two metrics for all the states, one metric if the transmitted bit was 0 and one if the transmitted bit was 1. The soft bit input values are estimates of a bit being 0 or 1. Typically these values are small integers representing the Euclidean distance from an optimal constellation point. At each state the cumulative path metric for the whole data packet is used to make a decision of the survivor path, however, a cumulative OFDM symbol path metric, (NOT a cumulative whole packet path metric) is computed for each OFDM symbol that produced the bit. After the whole packet is processed with the algorithm, each symbol cumulative path metric is associated with it.

The method calculates an estimate of the OFDM symbol being interfered with based on the mean and the variance of the cumulative per symbol path metrics. Each symbol path metric is compared to the whole data packet OFDM metric distribution and if larger than whole packet mean+ alpha*standard deviation then the symbol is deemed to most probably contain an error. Typically the coefficient alpha is in the range of 1 to 2. A larger value indicating a higher deviation is required for classifying a symbol as containing an error. FIG. 1 shows an OFDM symbol path metric for two redundant packets sent at different times, separated by a small time interval. Each packet contains more than 100 OFDM symbols as indicated on the horizontal axis. The path metric is on the vertical axis. The thick line shows a threshold computed from the mean and the standard deviation with alpha=2. The symbols that have a metric that exceed the threshold are marked as potentially containing bit errors.

The output of the algorithm is an estimate of the OFDM symbols that have a high likelihood to contain one or more bit errors (caused by burst interferers) if CRC after Viterbi decoding fails.

Since certain changes may be made in the above described system and method for a symbol error detection without departing from the scope of the invention herein involved, it is intended that all matter contained in the description thereof or shown in the accompanying FIGURE shall be interpreted as illustrative and not in a limiting sense.

What is claimed is:

1. A method to compute the probability of an OFDM (orthogonal frequency division multiplexing) symbol containing one or more bit errors in a whole data packet containing OFDM symbols by computing a cumulative OFDM symbol by symbol path metric comprising:

first computing a cumulative OFDM symbol path metric from error correction code for each OFDM symbol that produces a bit in a whole data packet;

then computing a cumulative whole data packet path metric from error correction code for all OFDM symbols that produce a bit in a whole data packet;

then comparing said each cumulative OFDM symbol path metric to a threshold computed by adding said cumulative whole packet path metric's mean to a predetermined constant times the standard deviation of said cumulative whole packet path's metric; and, wherein said OFDM symbols having a cumulative OFDM symbol path metric higher than said threshold are determined to have a high probability of having been interfered with and containing bit errors.

* * * * *